United States Patent
Stidsen et al.

(10) Patent No.: US 11,410,699 B1
(45) Date of Patent: Aug. 9, 2022

(54) USB-C PD POWERED PHONO PREAMPLIFER

(71) Applicant: Lenbrook Industries Limited, Pickering (CA)

(72) Inventors: Gregory R. Stidsen, Andover, MA (US); Andrew Haines, Pickering (CA); Jens Torben Sonderskov, Toronto (CA); Taresh Vadgama, Pickering (CA)

(73) Assignee: Lenbrook Industries Limited, Pickering (CA)

( * ) Notice: Subject to any disclaimer, the term of this patent is extended or adjusted under 35 U.S.C. 154(b) by 0 days.

(21) Appl. No.: 17/574,063

(22) Filed: Jan. 12, 2022

(51) Int. Cl.
| | |
|---|---|
| *G11B 3/00* | (2006.01) |
| *G11B 20/02* | (2006.01) |
| *H03M 1/00* | (2006.01) |
| *G11B 3/64* | (2006.01) |
| *H03G 3/30* | (2006.01) |
| *H03G 7/00* | (2006.01) |
| *H03F 3/68* | (2006.01) |

(52) U.S. Cl.
CPC .............. *G11B 20/02* (2013.01); *G11B 3/64* (2013.01); *H03M 1/001* (2013.01); *H03F 3/68* (2013.01); *H03G 3/3089* (2013.01); *H03G 7/002* (2013.01)

(58) Field of Classification Search
CPC .......... G11B 20/02; G11B 3/64; H03M 1/001; H03G 3/3089; H03G 7/002; H03F 3/68
See application file for complete search history.

(56) References Cited

U.S. PATENT DOCUMENTS

2017/0250665 A1* 8/2017 Randall ................. H03F 1/3217

OTHER PUBLICATIONS

Art Pro Audio Phono Preamp/Interface w/ USB: Long & McQuade Musical Instruments: 2 pages (2022).
Behringer Microphono PP400 Ultra-Compact Phono Preamp, Silver: Amazon.com: 7 pages (2022).
Behringer UFQ202 Audio Interface: Amazon.com: 10 pages (2022).

* cited by examiner

*Primary Examiner* — Joseph J Lauture
(74) *Attorney, Agent, or Firm* — Foley Hoag LLP; Rajesh Vallabh

(57) ABSTRACT

A phono-preamplifier for processing audio output signals from a turntable is powered by a variable voltage adapter such as a USB-C PD power supply adapter.

22 Claims, 4 Drawing Sheets

USB-C PD POWERED PHONO PREAMPLIFER

BACKGROUND

Consumers have had limited accessibility to High Resolution digital audio (audio files with greater than 48 kHz sample rate or higher than 16-bit audio bit depth). Lenbrook Industries Limited (owner of NAD Electronics and Bluesound Music Systems and the applicant of the present application) began development of a new type of High Resolution media audio playback system in 2004 and demonstrated such a system in 2009. By 2011, the NAD Masters Digital Suite Home Sound System enabled consumers to experience music via one or more networked playback devices. The system's BluOS operating system was expanded to more affordable devices with the introduction of the Bluesound brand in 2012. Through a software control application installed on a controller (e.g., IR remote, wall mounted controller, smartphone, tablet, computer, voice input device), consumers can play what they desire in any room having a networked playback device. They can access High Resolution music files by each room with a playback device and group rooms together for synchronous playback of the same music. The BluOS modular software design also allows the unification of audio video receiver (AVR) devices, reducing the cost of software development compared to highly proprietary MCU/DSP software currently used throughout the AVR industry.

The present application relates generally to phonograph (phono) preamplifers and, more particularly, to a USB-C PD powered phono preamplifer connected to a local area network (LAN).

The phonographic audio playback device was among the most significant inventions of the 20th century. Although most music is enjoyed with mobile devices and in digital audio formats, the phonographic 'turntable' remains very popular among music collectors and other advanced consumers who recognize the authentic listening experience it provides. Much of the world's most successful music recordings were originally recorded and mastered for playback on vinyl turntables. Although digital re-issues available on CD and music streaming services allow users to conveniently enjoy these recordings, many contend that the original vinyl copies sound superior. This has created a revival of classic albums on re-issued on high-quality vinyl and online sales of rare, original vinyl copies recognized to represent a record company's best vinyl issue or 'pressing'. Audiophiles and collectors also have an extensive choice of vinyl playback hardware—including newly manufactured turntables and diamond styli available from established and emerging equipment brands.

High-quality turntables still require specialized processing of their output signals before audio power amplification is applied to drive large loudspeakers. This processing step is performed by a phono preamplifier, and includes high-gain amplification and standardized frequency equalization. A phono preamplifier effectively conditions the small electrical signals of a turntable's magnetically coupled diamond stylus. The large signal gain and frequency equalization curve of a phono preamplifier presents difficult technical challenges.

Without careful attention to the preamp's power supply quality, the turntable's small music signal is easily overrun with electrical noise. Also, the high dynamic range of a turntable music signal along with the circuit's frequency equalization requires the preamplifier circuitry be supplied with a relatively high voltage. The voltage level provides sufficient 'headroom' to prevent saturation during loud music passages. Saturation could potentially damage the expensive audio power amplifier and loudspeakers. When the goal is a high-performance phono preamp, a low-noise and high-voltage power supply represents the costliest portion of a phono preamp device. The best phono preamp devices currently on the market employ conventional 'linear' power supplies to minimize electrical noise compared to modern switch-mode power supplies. High-end phono preamp devices ship with expensive, specialized external linear power adapters typically with a 12 VDC minimum voltage. This powers an operational amplifier ("op-amp") circuit internal to the phono preamplifier device. This circuit applies the gain and the 'RIAA' standard phono equalization curve as originally specified by the recording industry.

Cost-reduction of the above circuitry without compromising the final audio listening quality was simply not possible. The cost explains why most consumer device manufacturers began removing the phono preamp feature from products in the late 1980s as vinyl's broad popularity was in decline. Low-cost USB external power adapter devices became available in the 2000s, but their low output voltage and digital switching noise did not lend them to high-quality phono preamplification. It is conceivable that the voltage and noise issues of USB 2.0 supplies could be addressed with additional switch-mode voltage boost and linear regulation, although this would eliminate the desired cost reduction.

BRIEF SUMMARY OF THE DISCLOSURE

In accordance with one or more embodiments, a phono-preamplifier powered by a variable voltage adapter is disclosed for processing audio output signals from a turntable. The phono-preamplifier includes an audio input port coupled by a cable to the turntable to receive the audio output signals from the turntable. A power input port in the phono-preamplifier is coupled by a cable to the variable voltage adapter to receive power from the variable voltage adapter. A power controller subsystem is coupled to the power input port to manage the power received at the power input port. A microprocessor subsystem is coupled to the power controller subsystem to control operation of the power controller subsystem. An operational amplifier circuit is coupled to the audio input port and the power controller subsystem for amplifying and conditioning the audio output signals from the turntable. An analog-to-digital converter (ADC) is coupled to the operational amplifier circuit for converting amplified and conditioned audio output signals from the operational amplifier circuit to a digital bitstream output. The microprocessor subsystem is coupled to the ADC to receive and process the digital bitstream output for transmission over wired or wireless networks to be rendered on one or more speaker devices.

In one or more embodiments, the variable voltage adapter comprises a USB-C powered device power supply adapter.

In one or more embodiments, an op-amp power circuit is coupled to the power controller subsystem and to the operational amplifier circuit. The op-amp power circuit is configured to split the output voltage of power received from the power controller subsystem into two power supply rails of equivalent voltage but opposite polarity to power the operational amplifier circuit. In one or more embodiments, the output voltage is 12 VDC and the two equivalent power supply rails comprise +/−6 VDC rails.

In one or more embodiments, the operational amplifier circuit performs high-gain amplification and standardized frequency equalization to the audio output signals from the turntable.

In one or more embodiments, the variable voltage adapter supplies power to the phono-preamplifier at an output voltage sufficiently high to reduce effects of electrical noise and prevent saturation during loud music passages.

In one or more embodiments, the variable voltage adapter includes switch-mode power supply circuitry.

In one or more embodiments, the microprocessor subsystem configures the power controller subsystem to request 12 VDC voltage from the variable voltage adapter.

In one or more further embodiments, a method is disclosed for powering a phono-preamplifier for processing audio output signals from a turntable using a variable voltage adapter. The method includes the steps of: receiving the audio output signals from the turntable; receiving power from the variable voltage adapter; managing the power from the variable voltage adapter; amplifying and conditioning the audio output signals from the turntable using power from the variable voltage adapter; converting the amplified and conditioned audio output signals to a digital bitstream output; and processing the digital bitstream output for transmission over wired or wireless networks to be rendered on one or more speaker devices.

BRIEF DESCRIPTION OF THE DRAWINGS

Like or identical reference numbers are used to identify common or similar elements.

DETAILED DESCRIPTION

Various embodiments disclosed herein relate to a phono-preamplifier for processing audio output signals from a turntable powered by a variable voltage adapter such as a USB-C PD ('Powered Device') power supply adapter.

USB-C PD power supply adapters recently became available. As they follow an industry standard specification, many manufacturers can produce USB-C PD adapters in very high volumes and at lower cost than the traditional linear power supply adapters typically used in high-end phono preamp devices. USB-C PD adapter devices can deliver substantially more power and higher voltages than their predecessor USB 2.0 power adapters. USB-C PD supports a variable output voltage. The voltage level can be set as high as 12 VDC via software negotiation with the device to which its supplying power. USB-C PD standard power supplies can be used to reduce the cost without compromising the audio performance. New USB-C PD supplies employ more modern switch-mode power supply circuitry than previous USB 2.0 generation, and devices in accordance with various embodiments are designed to substantially reduce or eliminate any remaining switch-mode power supply noise of USB-C PD devices.

Figure 1:
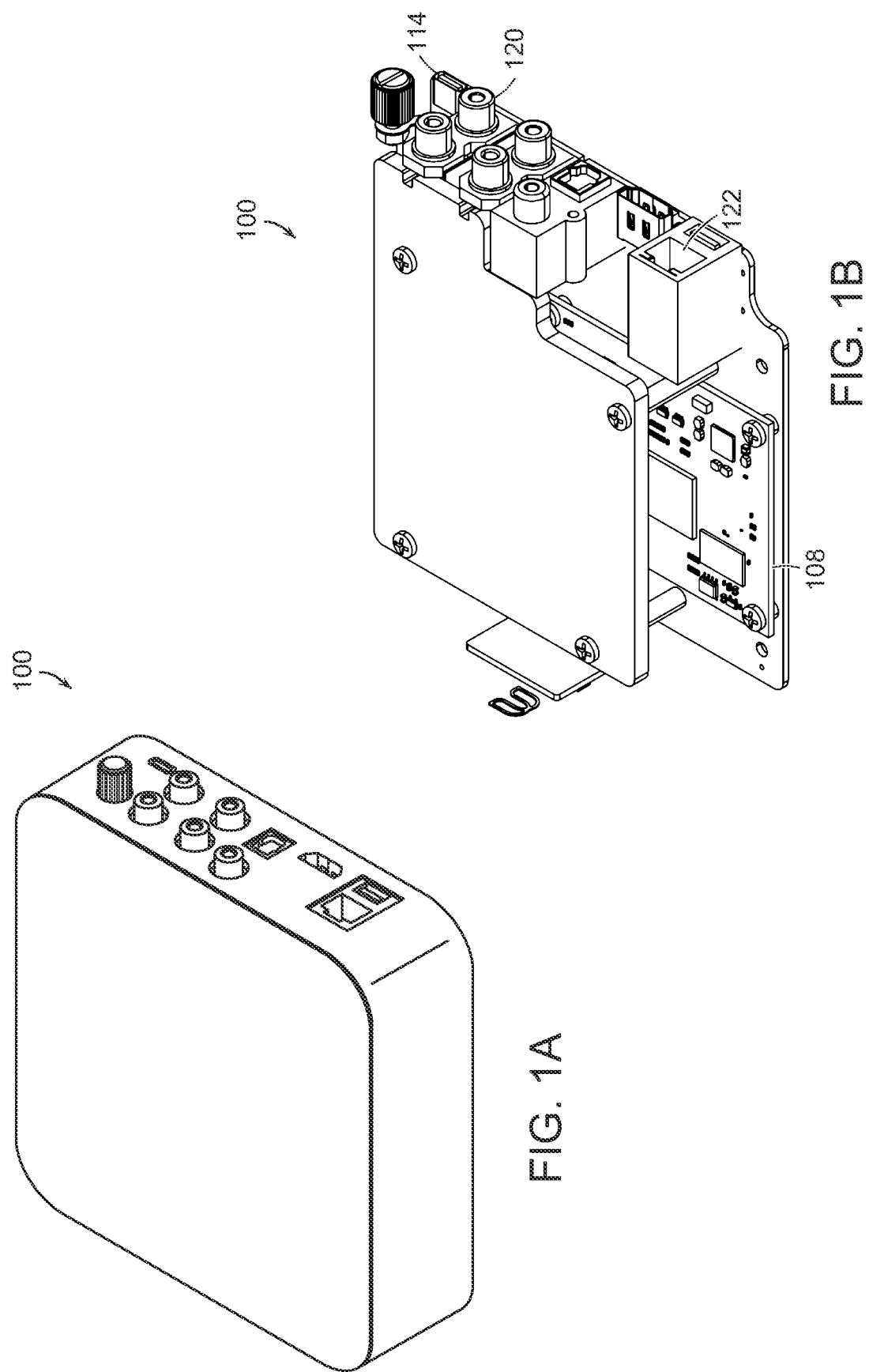
FIGS. 1A and 1B illustrate an exemplary USB-C PD powered phono preamplifer in accordance with one or more embodiments.

FIG. 1A illustrates an exemplary USB-C PD powered phono preamplifer 100 in accordance with one or more embodiments. FIG. 1B shows certain internal components of the preamplifer 100.

Figure 2:
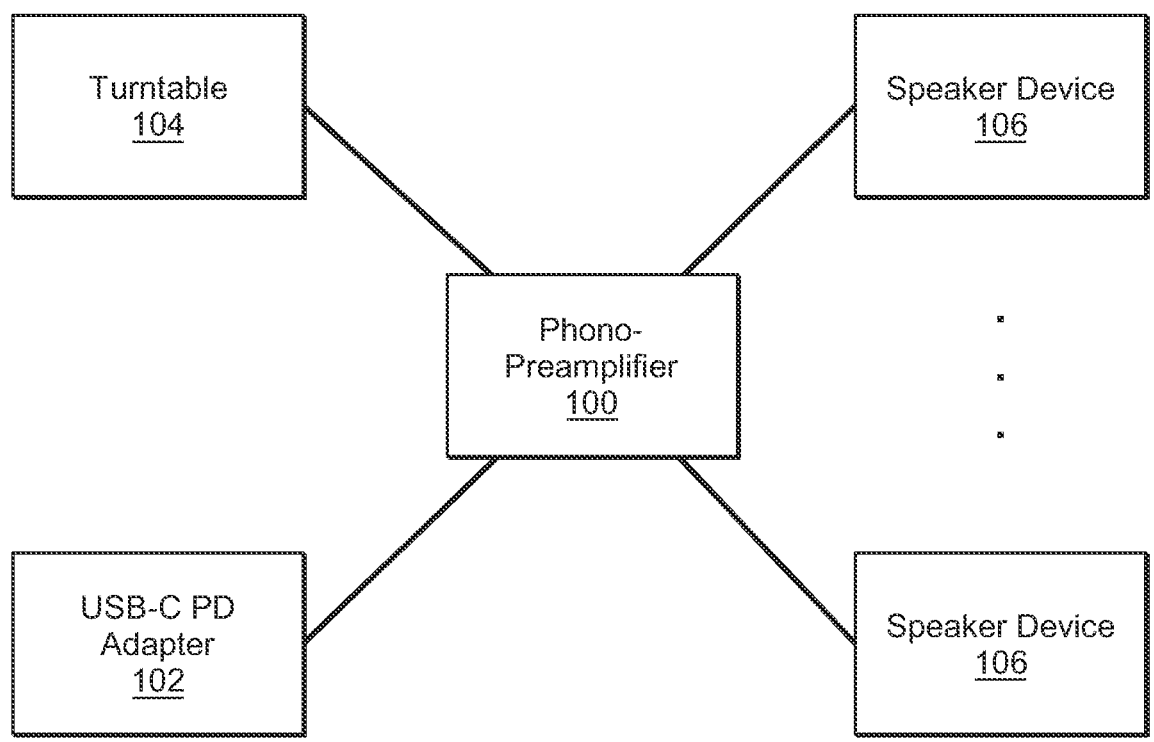
FIG. 2 is a block diagram illustrating connection of the USB-C PD powered phono preamplifer in a sound system in accordance with one or more embodiments.

FIG. 2 is a block diagram illustrating connection of the USB-C PD powered phono preamplifer 100 in a sound system in accordance with one or more embodiments. The phono-preamplifier 100 is powered by a USB-C PD power supply adapter 102. It receives audio output signals from a turntable 104 and amplifies and conditions the audio signals. The processed audio signals are transmitted by the phono-preamplifier 100 over wired or wireless networks to be rendered on one or more speaker devices 106.

Figure 3:
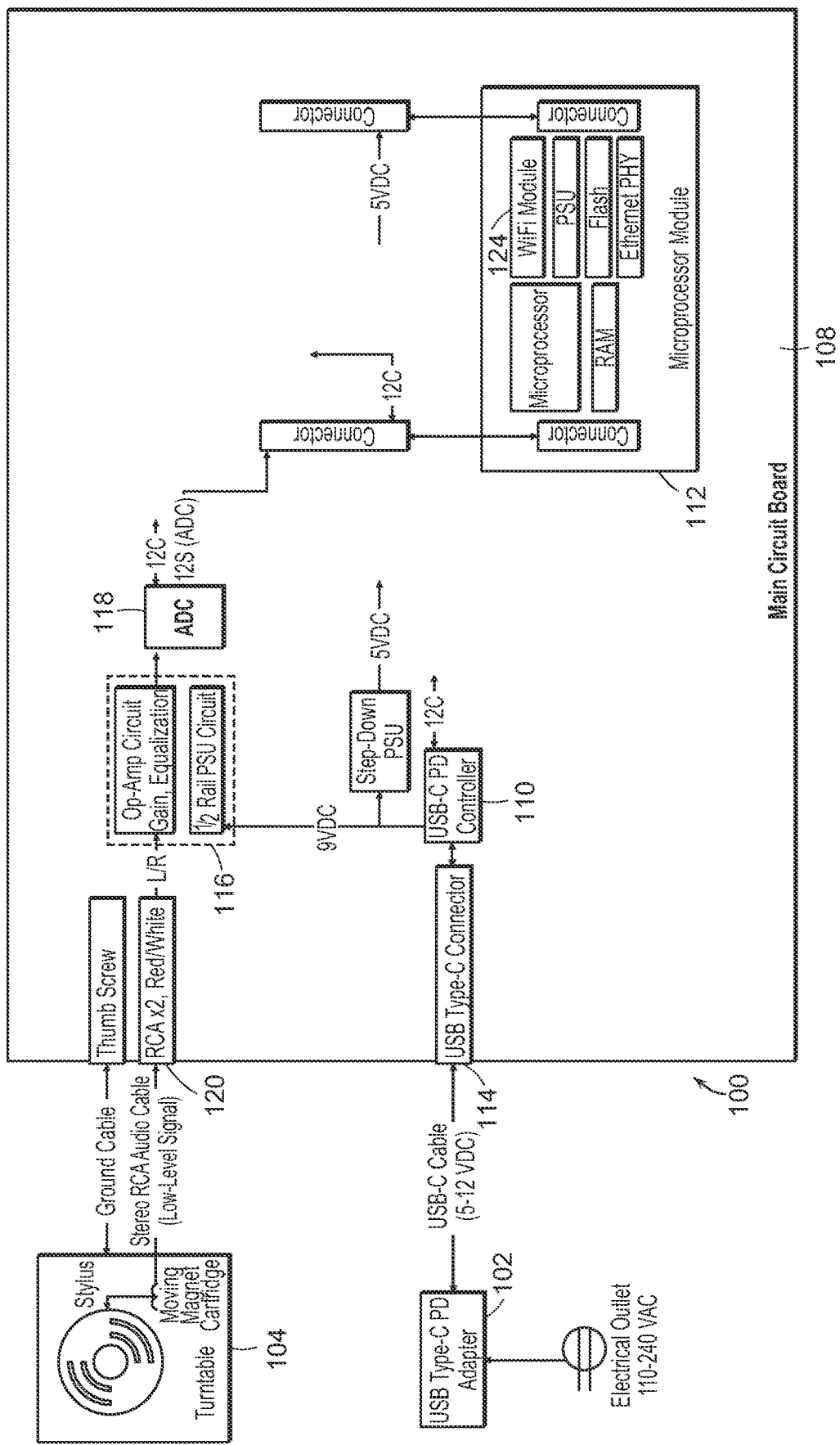
FIG. 3 is a block diagram illustrating an exemplary system architecture of the USB-C PD powered phono preamplifer in accordance with one or more embodiments.
Figure 4:
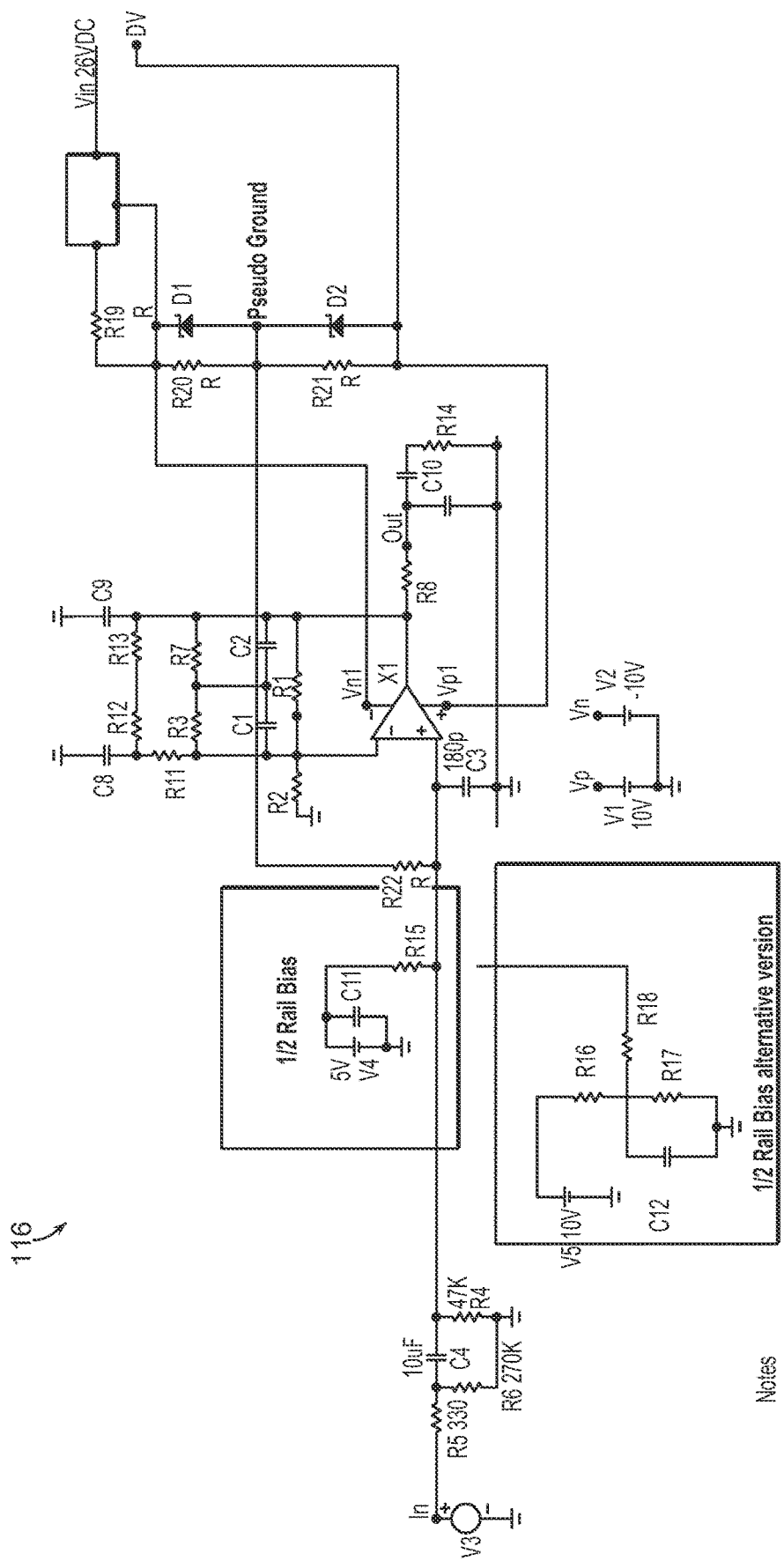
FIG. 4 is a circuit diagram illustrating an exemplary op-amp power circuit of the USB-C PD powered phono preamplifer in accordance with one or more embodiments.

FIG. 3 is a block diagram illustrating an exemplary system architecture of the USB-C PD powered phono preamplifer 100 in accordance with one or more embodiments. The phono preamplifer 100 includes a single electric circuit board assembly 108 powered by single USB-C PD power adapter 102. The circuit board assembly 108 includes a specialized USB-C power controller chip 110 and a microprocessor module 112 executing software. The microprocessor software communicates with the USB-C PD power controller chip 110. A USB-C socket 114 on the circuit board allows connection of a standard USB-C PD external power adapter 102. When the external power adapter 102 is connected, the USB-C PD power controller chip 110 notifies the microprocessor software. The software then configures the power controller chip 110 to request 12 VDC voltage from the external power adapter 102.

The power controller chip 110 notifies the microcontroller's software that 12 VDC has been confirmed as available from the external USB-C power adapter 102. The 12 VDC power is applied to a specialized op-amp power circuit 116, in which a single resistor splits the 12 VDC into two equivalent power supply rails. This effectively supplies the op-amp with split +/−6 VDC rails, allowing the op-amp to operate with optimal signal performance. Other electronic component values connected to the op-amp allow it to apply gain and frequency equalization to the incoming turntable signal received at port 120. The conditioned audio output signal is applied to the input of a high-quality analog-to-digital converter (ADC) 118. The microprocessor 112 accepts the digital bitstream output of the ADC 118 for transmission over the wired or wireless LANs to which the phono preamplifier device 100 has been connected. The digital bitstream is output to a wired network via a network port (e.g., an Ethernet port 122—FIG. 1B) in the phono-preamplifier or to a wireless network via a wireless network interface (e.g., WiFi module 124—FIG. 3) in the phono-preamplifier 100. In one or more embodiments, the phono-preamplifier 100 contains no other audio output.

In the illustrated embodiment, the USB-C PD powered phono preamplifer 100 comprises a separate device from the turntable 104. In one or more alternate embodiments, the USB-C PD powered phono preamplifer 100 is housed in the housing of the turntable 104.

Having thus described several illustrative embodiments, it is to be appreciated that various alterations, modifications, and improvements will readily occur to those skilled in the art. Such alterations, modifications, and improvements are intended to form a part of this disclosure, and are intended to be within the spirit and scope of this disclosure. While some examples presented herein involve specific combinations of functions or structural elements, it should be understood that those functions and elements may be combined in other ways according to the present disclosure to accomplish the same or different objectives. In particular, acts, elements, and features discussed in connection with one embodiment are not intended to be excluded from similar or other roles in other embodiments. Additionally, elements and components described herein may be further divided into additional components or joined together to form fewer components for performing the same functions.

Accordingly, the foregoing description and attached drawings are by way of example only, and are not intended to be limiting.

The invention claimed is:

1. A phono-preamplifier powered by a variable voltage adapter for processing audio output signals from a turntable, comprising:
   an audio input port configured to be coupled by a cable to the turntable to receive the audio output signals from the turntable;
   a power input port configured to be coupled by a cable to the variable voltage adapter to receive power from the variable voltage adapter;
   power controller subsystem coupled to the power input port and configured to manage the power received at the power input port;
   a microprocessor subsystem coupled to the power controller subsystem to control operation of the power controller subsystem;
   an operational amplifier circuit coupled to the audio input port and the power controller subsystem for amplifying and conditioning the audio output signals from the turntable; and
   an analog-to-digital converter (ADC) coupled to the operational amplifier circuit for converting amplified and conditioned audio output signals from the operational amplifier circuit to a digital bitstream output,
   wherein the microprocessor subsystem is coupled to the ADC to receive and process the digital bitstream output for transmission over wired or wireless networks to be rendered on one or more speaker devices.

2. The phono-preamplifier of claim 1, wherein the variable voltage adapter comprises a USB-C powered device power supply adapter.

3. The phono-preamplifier of claim 1, further comprising an op-amp power circuit coupled to the power controller subsystem and to the operational amplifier circuit, said op-amp power circuit configured to split the output voltage of power received from the power controller subsystem into two power supply rails of equivalent voltage but opposite polarity to power the operational amplifier circuit.

4. The phono-preamplifier of claim 3, wherein the output voltage is 12 VDC and the two equivalent power supply rails comprise +/−6 VDC rails.

5. The phono-preamplifier of claim 1, wherein the operational amplifier circuit performs high-gain amplification and standardized frequency equalization to the audio output signals from the turntable.

6. The phono-preamplifier of claim 1, wherein the variable voltage adapter supplies power to the phono-preamplifier at an output voltage sufficiently high to reduce effects of electrical noise and prevent saturation during loud music passages.

7. The phono-preamplifier of claim 6, wherein the variable voltage adapter supplies power to the phono-preamplifier at a 12 VDC output voltage.

8. The phono-preamplifier of claim 1, wherein the variable voltage adapter includes switch-mode power supply circuitry.

9. The phono-preamplifier of claim 1, wherein the microprocessor subsystem configures the power controller subsystem to request 12 VDC voltage from the variable voltage adapter.

10. The phono-preamplifier of claim 1, wherein the phono-preamplifier is integrated in a housing of the turntable.

11. The phono-preamplifier of claim 1, wherein the phono-preamplifier outputs the digital bitstream to a wired network via a network port in the phono-preamplifier or to a wireless network via a wireless network interface in the phono-preamplifier, and wherein the phono-preamplifier contains no other audio output.

12. A method of powering a phono-preamplifier for processing audio output signals from a turntable using a variable voltage adapter, comprising the steps of:
   receiving the audio output signals from the turntable;
   receiving power from the variable voltage adapter;
   managing the power from the variable voltage adapter;
   amplifying and conditioning the audio output signals from the turntable using power from the variable voltage adapter;
   converting the amplified and conditioned audio output signals to a digital bitstream output; and
   processing the digital bitstream output for transmission over wired or wireless networks to be rendered on one or more speaker devices.

13. The method of claim 12, wherein the variable voltage adapter comprises a USB-C powered device power supply adapter.

14. The method of claim 12, further comprising splitting the output voltage of power received from the variable voltage adapter into two power supply rails of equivalent voltage but opposite polarity to power an operational amplifier circuit for amplifying and conditioning the audio output signals.

15. The method of claim 14, wherein the output voltage is 12 VDC and the two equivalent power supply rails comprise +/−6 VDC rails.

16. The method of claim 12, wherein amplifying and conditioning the audio output signals comprises performing high-gain amplification and standardized frequency equalization to the audio output signals from the turntable.

17. The method of claim 12, wherein the variable voltage adapter supplies power at an output voltage sufficiently high to reduce effects of electrical noise and prevent saturation during loud music passages.

18. The method of claim 17, wherein the variable voltage adapter supplies power at a 12 VDC output voltage.

19. The method of claim 12, wherein the variable voltage adapter includes switch-mode power supply circuitry.

20. The method of claim 12, further comprising negotiating a voltage level of power received from the variable voltage adapter.

21. A USB-C PD powered phono-preamplifier for processing audio output signals from a turntable, comprising:
   an audio input port configured to be coupled by a cable to the turntable to receive the audio output signals from the turntable;
   a power input port configured to be coupled by a cable to a USB-C powered device power supply adapter to receive power from the USB-C powered device power supply adapter;
   power controller subsystem coupled to the power input port and configured to manage the power received at the power input port;

a microprocessor subsystem coupled to the power controller subsystem to control operation of the power controller subsystem;
an operational amplifier circuit coupled to the audio input port and the power controller subsystem for amplifying and conditioning the audio output signals from the turntable; and
an analog-to-digital converter (ADC) coupled to the operational amplifier circuit for converting amplified and conditioned audio output signals from the operational amplifier circuit to a digital bitstream output,
wherein the microprocessor subsystem is coupled to the ADC to receive and process the digital bitstream output for transmission over wired or wireless networks to be rendered on one or more speaker devices.

22. The phono-preamplifier of claim 21, further comprising an op-amp power circuit coupled to the power controller subsystem and to the operational amplifier circuit, said op-amp power circuit configured to split the output voltage of power received from the power controller subsystem into two power supply rails of equivalent voltage but opposite polarity to power the operational amplifier circuit.

* * * * *